US012805386B2

(12) United States Patent
Masuda et al.

(10) Patent No.: US 12,805,386 B2
(45) Date of Patent: Nov. 17, 2026

(54) SEMICONDUCTOR DEVICE

(71) Applicant: Mitsubishi Electric Corporation, Tokyo (JP)

(72) Inventors: Akiyoshi Masuda, Tokyo (JP); Yuji Miyazaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 976 days.

(21) Appl. No.: 17/202,784

(22) Filed: Mar. 16, 2021

(65) Prior Publication Data

US 2021/0366886 A1 Nov. 25, 2021

(30) Foreign Application Priority Data

May 19, 2020 (JP) ................................ 2020-087148

(51) Int. Cl.
*H10W 90/00* (2026.01)
*H10D 62/832* (2025.01)
(Continued)

(52) U.S. Cl.
CPC ........ *H10W 90/00* (2026.01); *H10D 62/8325* (2025.01); *H10W 70/685* (2026.01); *H10W 76/15* (2026.01); *H10W 90/755* (2026.01)

(58) Field of Classification Search
CPC . H01L 23/053; H01L 23/49822; H01L 24/48; H01L 25/165; H01L 29/1608;
(Continued)

(56) References Cited

U.S. PATENT DOCUMENTS 3,390,341 A * 6/1968 Kline ..................... G06G 7/186
327/341
4,152,733 A * 5/1979 Melwisch ............ H04N 5/9315
386/E5.03
(Continued)

FOREIGN PATENT DOCUMENTS

DE 10 2014 110 366 A1 1/2015
DE 10 2016 101 339 A1 8/2016
(Continued)

OTHER PUBLICATIONS

Office Action issued in DE 10 2021 110 214.6; mailed by the German Patent and Trade Mark Office on Jun. 30, 2022.
(Continued)

*Primary Examiner* — Teresa M. Arroyo
(74) *Attorney, Agent, or Firm* — Studebaker Brackett PLLC

(57) ABSTRACT

A plurality of semiconductor elements connected in parallel with one another include a plurality of first semiconductor elements and a plurality of second semiconductor elements. A drive circuit to provide a gate signal to each of the plurality of semiconductor elements EL includes a main circuit and a plurality of inserted circuits including a first inserted circuit and a second inserted circuit. The first inserted circuit is inserted between the main circuit and the plurality of first semiconductor elements. The second inserted circuit is inserted between the main circuit and the plurality of second semiconductor elements. Each of the first inserted circuit and the second inserted circuit includes a first diode having a forward direction toward the main circuit and a second diode connected in anti-parallel with the first diode.

20 Claims, 7 Drawing Sheets

(51) Int. Cl.
*H10W 70/685* (2026.01)
*H10W 76/15* (2026.01)

(58) Field of Classification Search
CPC . H01L 2924/00012; H01L 2924/00014; H01L 2924/10272; H01L 2924/181; H01L 2924/19107; H01L 2224/48091; H01L 2224/48227; H01L 2224/48464; H01L 2224/73265; H01L 2224/48157; H01L 2224/291; H01L 2224/32225; H01L 2224/32238; H03K 17/161; H03K 17/687; H02M 1/088; H02M 7/5387
See application file for complete search history.

(56) References Cited

U.S. PATENT DOCUMENTS 4,594,650 A * 6/1986 Kinbara .................. H02M 1/34 363/56.05
5,227,655 A 7/1993 Kayama
5,298,808 A * 3/1994 Terrell ............. H03K 19/00361 326/112
5,796,599 A * 8/1998 Raonic ................ H02M 5/2573 363/57
5,831,349 A * 11/1998 Weng .................. H02M 5/2573 307/139
5,942,797 A * 8/1999 Terasawa .............. H01L 25/162 257/729
6,232,840 B1 * 5/2001 Teeter ..................... H03F 3/211 330/303
2002/0113274 A1 8/2002 Iwagami et al.
2004/0036511 A1 2/2004 Otoshi et al.
2010/0259855 A1 * 10/2010 Vanderzon ............. H05B 39/04 361/18
2011/0181993 A1 * 7/2011 Yamaguchi ......... H02M 7/5387 361/111
2011/0227630 A1 * 9/2011 Shinoda ............. H03K 17/0822 327/434
2013/0133358 A1 * 5/2013 Ito ......................... H02M 5/297 62/426
2014/0266437 A1 * 9/2014 Kelly ........................ H03F 1/22 330/253
2015/0028383 A1 1/2015 Voss et al.
2015/0035464 A1 * 2/2015 Maekawa ........... H02M 7/5387 318/400.21
2016/0233858 A1 8/2016 Wasekura et al.
2016/0270170 A1 * 9/2016 Mishima .............. H05B 45/325
2016/0352321 A1 * 12/2016 Yamaguchi ............. H02M 1/08
2017/0012030 A1 * 1/2017 Wang ....................... H01L 24/32
2017/0033790 A1 2/2017 Osanai
2017/0278824 A1 * 9/2017 Sawada ................... H01L 24/73
2018/0375508 A1 * 12/2018 Morisaki ............ H03K 17/0822
2019/0067151 A1 * 2/2019 Chen ................... H01L 23/5387
2019/0296014 A1 * 9/2019 Kahrimanovic ...... H02M 7/493
2021/0099071 A1 * 4/2021 Otake ................... H02M 7/003
2021/0167695 A1 * 6/2021 Yamakawa ........... H02M 7/217
2021/0175158 A1 * 6/2021 Yoshii ..................... H01L 24/49

FOREIGN PATENT DOCUMENTS

DE 11 2015 002 272 T5 2/2017
DE 112021002273 T5 * 3/2023 ............. H01L 21/52
EP 1939937 A2 * 7/2008 ....... H01L 23/49562
JP 09172359 A * 6/1997
JP H09-172359 A 6/1997
JP H09-275211 A 10/1997
JP 2002-094363 A 3/2002
JP 2002-246599 A 8/2002
JP 2004-096191 A 3/2004
JP 2020-048301 A 3/2020
WO 2015/175820 A1 11/2015
WO 2017026367 A1 2/2017

OTHER PUBLICATIONS

An Office Action; "Notice of Reasons for Refusal," mailed by the Japanese Patent Office on Apr. 4, 2023, which corresponds to Japanese Patent Application No. 2020-087148 and is related to U.S. Appl. No. 17/202,784; with English language translation.
An Office Action mailed by China National intellectual Property Administration on Jun. 30, 2023, which corresponds to Chinese Patent Application No. 202110528850.9 and is related to U.S. Appl. No. 17/202,784; with English language translation.
An Office Action mailed by China National Intellectual Property Administration on Mar. 20, 2024, which corresponds to Chinese Patent Application No. 202110528850.9 and is related to U.S. Appl. No. 17/202,784; with English language translation.
An Office Action; mailed by the China National Intellectual Property Administration of the People's Republic of China on Aug. 31, 2024 which corresponds to Chinese Patent Application No. 202110528850.9 and is related to U.S. Appl. No. 17/202,784.
An Office Action mailed by China National Intellectual Property Administration on Nov. 29, 2024, which corresponds to Chinese Patent Application No. 202110528850.9 and is related to U.S. Appl. No. 17/202,784; with English language translation.
An Office Action; "Notice of Reasons for Refusal," mailed by the Japanese Patent Office on Sep. 12, 2023, which corresponds to Japanese Patent Application No. 2020-087148 and is related to U.S. Appl. No. 17/202,784; with English language translation.

* cited by examiner

SEMICONDUCTOR DEVICE

BACKGROUND OF THE INVENTION

Field of the Invention

The present disclosure relates to semiconductor devices and, in particular, to a semiconductor device including a plurality of semiconductor elements connected in parallel with one another.

Description of the Background Art

A power semiconductor device includes semiconductor elements as switching elements in many cases. For example, semiconductor elements each having a gate electrode, such as metal oxide semiconductor field effect transistors (MOSFETs) and insulated gate bipolar transistors (IGBTs), are used. In particular, a high power semiconductor device often includes switching elements connected in parallel with one another. In the semiconductor device, positive feedback circuits are sometimes formed by parasitic capacitance and stray inductance of the semiconductor elements to result in occurrence of parasitic oscillations. The severity of parasitic oscillations is likely to increase in proportion to the number of semiconductor elements connected in parallel with one another. A circuit to suppress parasitic oscillations is often provided. According to WO 2017/026,367, a balance resistor unit having a diode is connected to each of semiconductor switching elements.

According to the above-mentioned conventional technology, balance resistor units equal in number to the number of semiconductor switching elements connected in parallel with one another are required. Thus, in a ease where many semiconductor switching elements are connected in parallel with one another, many diodes are required. This results in complication of a configuration of the semiconductor device.

SUMMARY

The present disclosure has been conceived to solve a problem as described above, and it is an object of the present disclosure to provide a semiconductor device having a simple configuration to suppress parasitic oscillations occurring among a plurality of semiconductor elements connected in parallel with one another.

A semiconductor device of the present disclosure includes a plurality of semiconductor elements and a drive circuit. The plurality of semiconductor elements are connected in parallel with one another, and each have a gate electrode. The plurality of semiconductor elements include a plurality of first semiconductor elements and a plurality of second semiconductor elements. The drive circuit is to provide a gate signal to the gate electrode of each of the plurality of semiconductor elements. The drive circuit includes a main circuit and a plurality of inserted circuits. The plurality of inserted circuits include a first inserted circuit and a second inserted circuit. The first inserted circuit is inserted between the main circuit and the plurality of first semiconductor elements. The second inserted circuit is inserted between the main circuit and the plurality of second semiconductor elements. Each of the first inserted circuit and the second inserted circuit includes a first diode having a forward direction toward the main circuit and a second diode connected in anti-parallel with the first diode.

According to the semiconductor device of the present disclosure, in a case where the gate electrode of the first semiconductor elements has a positive voltage with respect to the gate electrode of the second semiconductor elements, a current flowing from the first semiconductor elements to the second semiconductor elements is interrupted unless the positive voltage exceeds the sum of a forward voltage of the first diode of the first inserted circuit and a forward voltage of the second diode of the second inserted circuit. In contrast, in a case where the gate electrode of the second semiconductor elements has a positive voltage with respect to the gate electrode of the first semiconductor elements, a current flowing from the second semiconductor elements to the first semiconductor elements is interrupted unless the positive voltage exceeds the sum of a forward voltage of the first diode of the second inserted circuit and a forward voltage of the second diode of the first inserted circuit. Parasitic oscillations are removed by interruption of these currents while a voltage across the plurality of first semiconductor elements and the plurality of second semiconductor elements is sufficiently low. In other words, parasitic oscillations having small amplitudes are removed. Parasitic oscillations having large amplitudes occurring due to development of parasitic oscillations having small amplitudes are thereby suppressed. On the other hand, the plurality of semiconductor elements are connected to each of the inserted circuits, so that the number of inserted circuits can be smaller than the number of semiconductor elements. A configuration of the semiconductor device can thus be simplified. As described above, parasitic oscillations occurring among the plurality of semiconductor elements connected in parallel with one another can be suppressed by the simple configuration.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
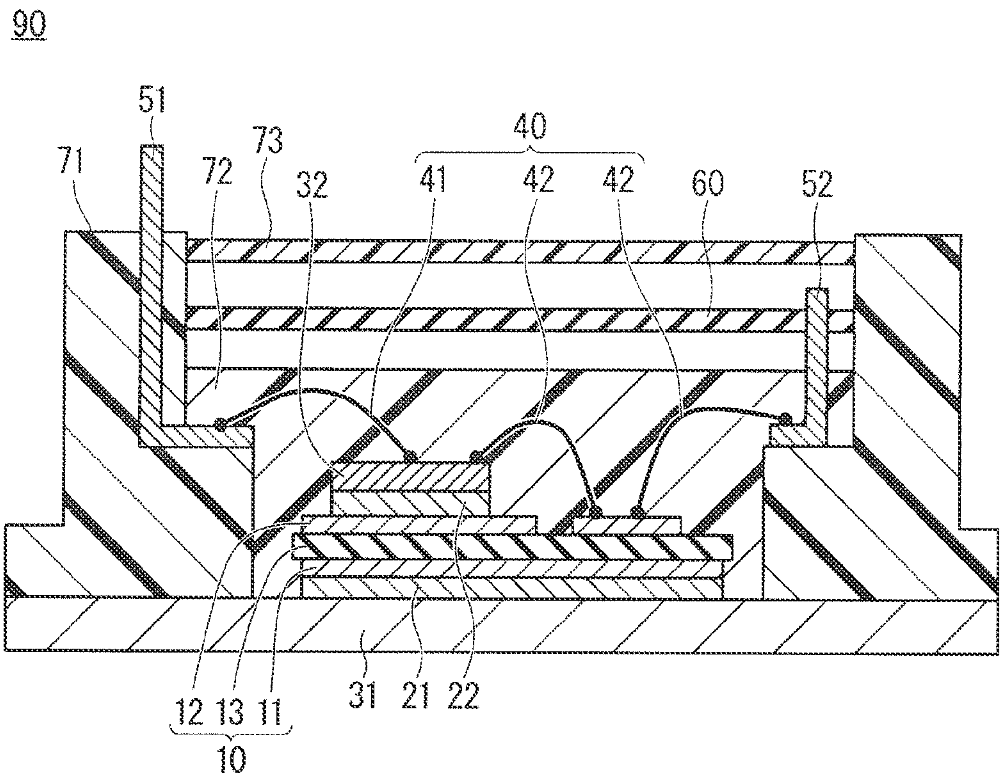
FIG. 1 is a cross-sectional view illustrating an example of a configuration of a semiconductor device in Embodiment 1.

Embodiments will be described below based on the drawings. The same or similar components bear the same reference signs in the drawings described below, and description thereof will be not repeated.

Embodiment 1

FIG. 1 is a cross-sectional view illustrating an example of a configuration of a semiconductor device 90 in Embodiment 1. The semiconductor device 90 includes an insulating substrate 10 (a first substrate), a solder joint 21, a solder joint 22, a base plate 31, at least one semiconductor chip 32 (semiconductor component), a plurality of wires 40, a plurality of main electrodes 51, a drive electrode 52, a printed circuit board 60 (second substrate), a case 71, a sealing material 72, and a lid 73. The insulating substrate 10 includes an insulating plate 13 having a first surface (a lower surface in FIG. 1) and a second surface (an upper surface in FIG. 1), a conductor layer 11 located on the first surface, and a conductor layer 12 located on the second surface and having a pattern. The plurality of wires 40 include a main wire 41 and drive wires 42.

The case 71 has a space to be closed by the case 71 being combined with the base plate 31 and the lid 73, and the other members described above are housed in the space. The main electrodes 51 and the drive electrode 52 have been attached to the case 71. The main electrodes 51 are for a high current to be controlled by the semiconductor device 90, and the drive electrode 52 is to receive a drive signal from outside the semiconductor device 90. The conductor layer 11 of the insulating substrate 10 is joined to the base plate 31 by the solder joint 21. The semiconductor chip 32 is joined to the conductor layer 12 of tire insulating substrate 10 by the solder joint 22. The main electrodes 51 are electrically connected to the semiconductor chip 32 through the main wire 41. The drive electrode 52 is electrically connected to the semiconductor chip 32 through the drive wires 42 and the conductor layer 12. The semiconductor chip 32 mounted on the conductor layer 12 and the wires 40 are covered with the sealing material 72 formed of a gel. The sealing material 72 and the outside of the ease 71 are separated by the lid 73. There is a space between the sealing material 72 and the lid 73, and the printed circuit board 60 is disposed in the space.

Figure 2:
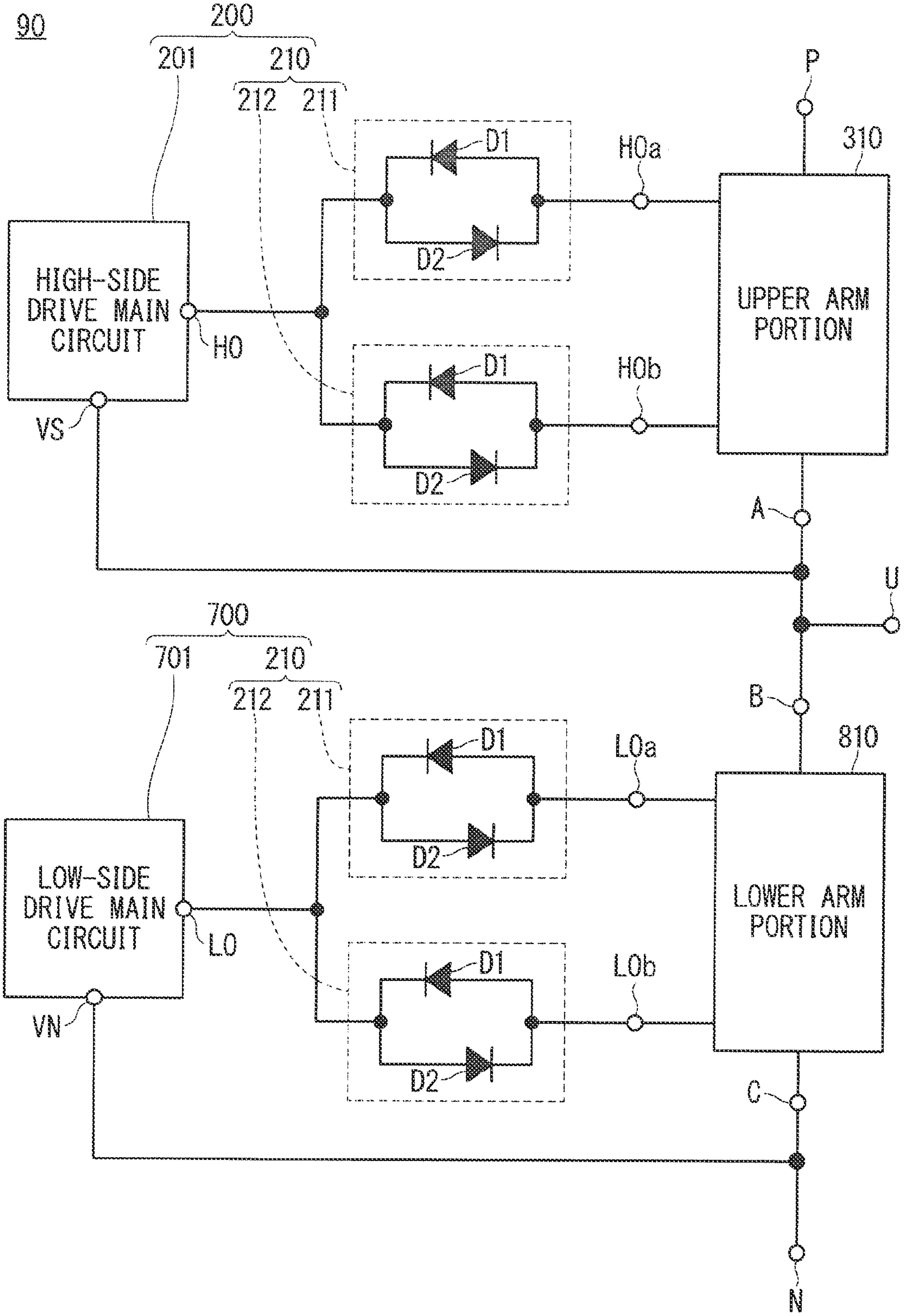
FIG. 2 is a block diagram partially showing the configuration of the semiconductor device of FIG. 1.

FIG. 2 is a block diagram partially showing the configuration of the semiconductor device 90 of FIG. 1. The semiconductor device 90 is a power semiconductor device, specifically an inverter device to receive an external control signal while being subjected to application of a reference potential to a terminal N and application of a high voltage to a terminal P to thereby generate high power from a terminal U in response to the control signal. The terminals P, N, and U are configured by the plurality of main electrodes 51 (FIG. 1). Electrical paths from these terminals may be configured using the main wire 41 (FIG. 1). A single phase ("2 in 1") inverter device can be obtained by the configuration of FIG. 2, but two or three phase inverter device can be configured by providing a plurality of configurations similar to the configuration of FIG. 2, for example.

The semiconductor device 90 includes a high-side drive circuit 200, an upper arm portion 310, a low-side drive circuit 700, and a lower arm portion 810. The high-side drive circuit 200 includes a high-side drive main circuit 201 and a plurality of inserted circuits 210. The plurality of inserted circuits 210 include a first inserted circuit 211 and a second inserted circuit 212. The low-side drive circuit 700 includes a low-side drive main circuit 701 and a plurality of inserted circuits 210. The high-side drive main circuit 201 has a terminal VS and a terminal HO. The high-side drive main circuit 201 generates, from the terminal HO, a gate signal for the upper arm portion 310, using a potential applied to the terminal VS as a reference potential. The low-side drive main circuit 701 generates, from a terminal LO, a gate signal for the lower arm portion 810, using a potential applied to a terminal VN as a reference potential. The inserted circuits 210 of each of the high-side drive circuit 200 and the low-side drive circuit 700 may be mounted, on the printed circuit board 60. Each of the high-side drive main circuit 201 and the low-side drive main circuit 701 has a terminal to receive the external control signal and a terminal to be provided with a power supply voltage, which are not shown.

Each of the high-side drive main, circuit 201 and the low-side drive main circuit 701 may be configured by an integrated circuit (IC) chip, or both the high-side drive main circuit. 201 and the low-side drive main circuit 701 may be configured by a single IC chip. The high-side drive main circuit 201 and the low-side drive main circuit 701 may be mounted on the printed circuit board 60, or may be arranged outside the case 71 without being mounted on the printed circuit board 60. A short-circuit protection circuit may be mounted on the printed circuit board 60 together with the high-side drive main circuit 201 and the low-side drive main circuit 701.

Figure 3:
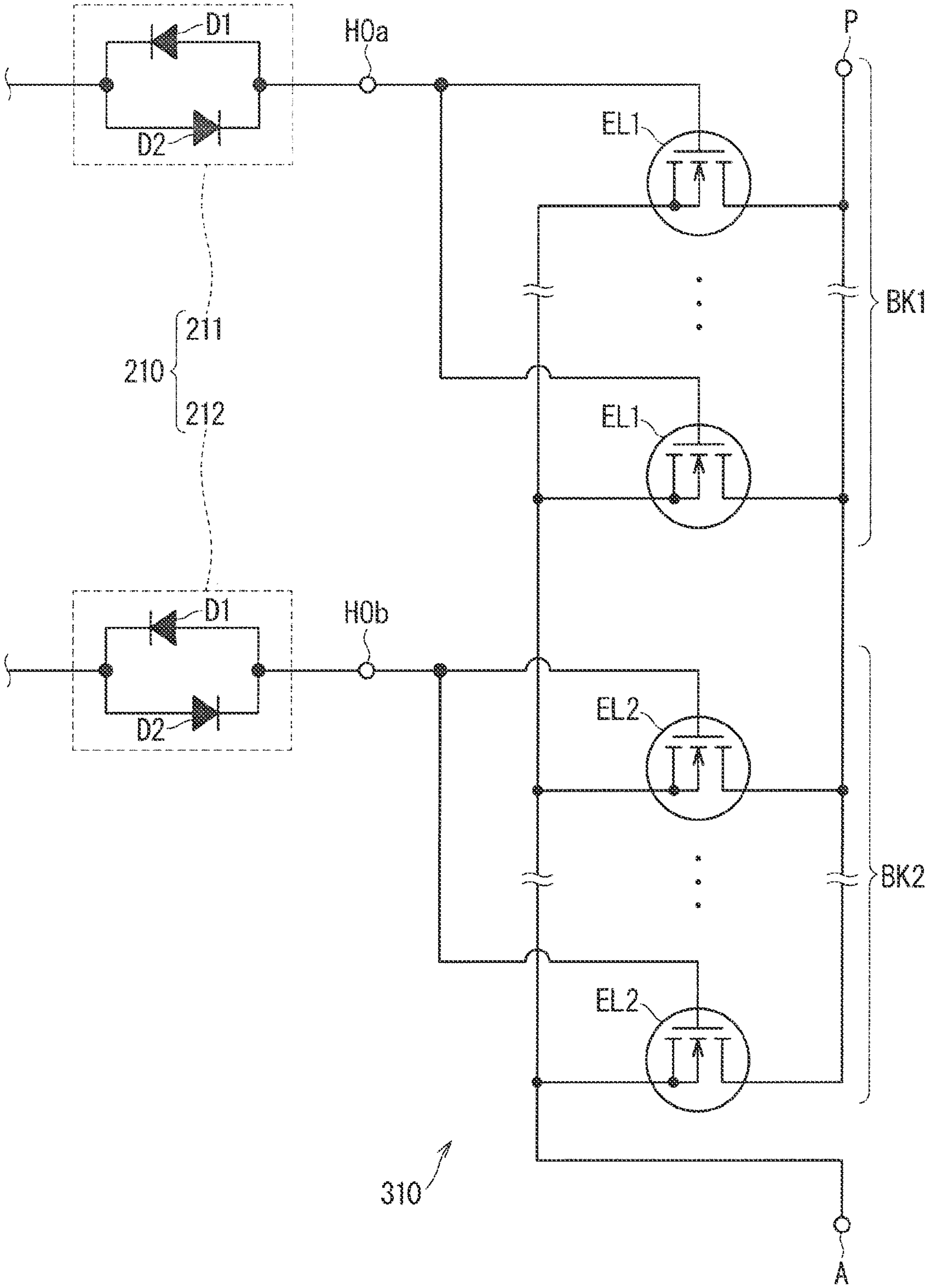
FIG. 3 is a circuit diagram schematically showing an upper arm portion and a plurality of inserted circuits connected to the upper arm portion of FIG. 2.

FIG. 3 is a circuit diagram schematically showing the upper arm portion 310 and the plurality of inserted circuits 210 connected to the upper arm portion 310 of FIG. 2. The upper arm portion 310 includes a plurality of semiconductor elements, specifically a plurality of first semiconductor elements EL1 and a plurality of second semiconductor elements EL2. In the present description, the plurality of semiconductor elements including the plurality of first semiconductor elements EL1 and tire plurality of second semiconductor elements EL2 are genetically referred to as semiconductor elements EL. In the present embodiment, the upper arm portion 310 is partitioned into two blocks, a first block BK1 and a second block BK2. From among the plurality of semiconductor elements EL, semiconductor elements EL arranged in the first block BK1 are the first semiconductor elements EL1, and semiconductor demerits EL arranged in the second block BK2 are the second semiconductor elements EL2. The number of first semiconductor elements EL1 and the number of second semiconductor elements EL2 are each any number greater than one. The first semiconductor elements EL1 and the second semiconductor elements EL2 are preferably equal in number.

Figure 4:
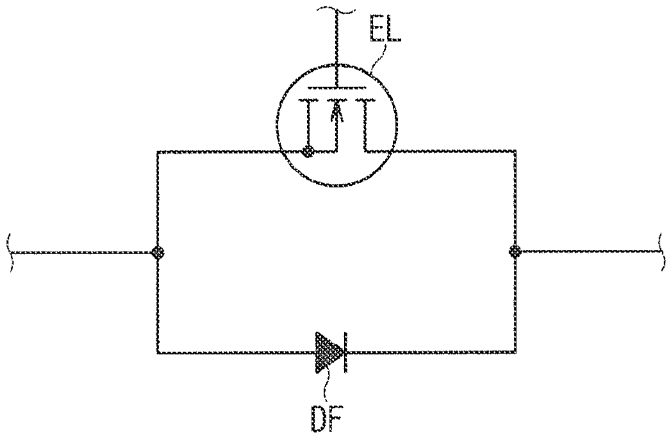
FIG. 4 is a circuit diagram showing a state of a freewheeling diode being connected in parallel with each of a plurality of semiconductor elements of FIG. 3.

The plurality of semiconductor elements EL (FIG. 3) are configured by the at least one semiconductor chip 32 (FIG. 1), and are thus mounted on the insulating substrate 10 (FIG. 1). The plurality of semiconductor elements EL are connected in parallel with one another. One end of the parallel connection is connected to the terminal P. The other end of the parallel connection is connected to a terminal A connected to the terminal U. Each of the plurality of semiconductor elements EL is a semiconductor switching element having a gate electrode, and is a MOSFET or an IGBT, for example. In a case of MOSFETs, the above-mentioned parallel connection is configured by substantially short-circuiting source electrodes thereof and also substantially short-circuiting drain electrodes thereof. In a case of IGBTs, the above-mentioned parallel connection is configured by substantially short-circuiting emitter electrodes thereof and also substantially short-circuiting collector electrodes thereof. Although not shown, in FIG. 3, a freewheeling diode DF may be connected in parallel with each of the semiconductor elements EL as shown in FIG. 4.

The high-side drive circuit 200 (FIG. 2) is to provide the gate signal to the gate electrode of each of the plurality of semiconductor elements EL of the upper arm portion 310. The first inserted circuit 211 of the high-side drive circuit 200 is inserted between the high-side drive main circuit 201 (FIG. 2) and gate electrodes of the plurality of first semiconductor elements EL1 (FIG. 3). The second inserted circuit 212 of the high-side drive circuit 200 is inserted between the high-side drive main circuit 201 (FIG. 2) and gate electrodes of the plurality of second semiconductor elements EL2 (FIG. 3). Specifically, the first inserted circuit 211 is inserted between the terminal HO and a terminal HOa. The terminal HOa is electrically connected to the gate electrodes of the plurality of first semiconductor elements EL1, but is not electrically connected to the gate electrodes of the plurality of second semiconductor elements EL2. The second inserted circuit 212 is inserted between the terminal HO and a terminal HOb. The terminal HOb is electrically connected to the gate electrodes of the plurality of second semiconductor elements EL2, but is not electrically connected to tire gate electrodes of the plurality of first semiconductor elements EL1.

A detailed configuration of the lower arm portion 810 (FIG. 2) is not shown, but the lower arm portion 810 has a substantially similar configuration to the upper arm portion 310 (FIG. 3) described in details above. The lower arm portion 810 is different from the upper arm portion 310 in that one end of parallel connection of the plurality of semiconductor elements EL of the lower arm portion 810 is connected to a terminal B connected to the terminal U. The other end of the parallel connection is connected to a terminal C connected to the terminal N. A specific configuration of the lower arm portion 810 corresponds to the configuration of the upper arm portion 310 shown in FIG. 3 in which the terminal HOa, the terminal HOb, the terminal P, and the terminal A have respectively been read as a terminal LOa, a terminal LOb, the terminal B, and the terminal C.

The low-side drive circuit 700 (FIG. 2) is to provide the gate signal to the gate electrode of each of the plurality of semiconductor elements EL of the lower arm portion 810. The first inserted circuit 211 of the low-side drive circuit 700 is inserted between the low-side drive main circuit 701 (FIG. 2) and gate electrodes of the plurality of first semiconductor elements EL1 (FIG. 3). The second inserted circuit 212 of the low-side drive circuit 700 is inserted between the low-side drive main circuit 701 (FIG. 2) and gate electrodes of the plurality of second semiconductor elements EL2 (FIG. 3). Specifically, the first inserted circuit 211 is inserted between the terminal LO and the terminal LOa. The terminal LOa is electrically connected to the gate electrodes of the plurality of first semiconductor elements EL1, but is not electrically connected to the gate electrodes of the plurality of second semiconductor elements EL2. The second inserted circuit 212 is inserted between the terminal LO and the terminal LOb. The terminal LOb is electrically connected to the gate electrodes of the plurality of second semiconductor elements EL2, but is not electrically connected to the gate electrodes of the plurality of first semiconductor elements EL1.

Each of the first inserted circuit 211 and the second inserted circuit 212 of the high-side drive circuit 200 includes a first diode D1 having a forward direction toward the high-side drive main circuit 201 and a second diode D2 connected in anti-parallel with the first diode D1. Each of the first, inserted circuit 211 and the second inserted circuit 212 of the low-side drive circuit 700 similarly includes a first diode D1 having a forward direction toward the low-side drive main circuit 701 and a second diode D2 connected in anti-parallel with the first diode D1.

According to the present embodiment, in a case where the gate electrode of the first semiconductor elements EL1 has a positive voltage with respect to the gate electrode of the second semiconductor elements EL2, a current flowing from the first semiconductor elements EL1 to the second semiconductor elements EL2 is interrupted unless the positive voltage exceeds the sum of a forward voltage of the first diode D1 of the first inserted circuit 211 and a forward voltage of the second diode D2 of the second inserted circuit 212. In contrast, in a case where the gate electrode of the second semiconductor elements has a positive voltage with respect to the gate electrode of the first semiconductor elements, a current flowing from the second semiconductor elements EL2 to the first semiconductor elements EL1 is interrupted unless the positive voltage exceeds the sum of a forward voltage of the first diode D1 of the second inserted circuit 212 and a forward voltage of the second diode D2 of the first inserted circuit 211. Parasitic oscillations occurring between the first block BK1 and the second block BK2 are removed by interruption of these currents while a voltage across the plurality of first semiconductor elements EL1 and the plurality of second semiconductor elements EL2 is sufficiently low. In other words, parasitic oscillations having small amplitudes are removed. Parasitic oscillations having large amplitudes occurring due to development of parasitic oscillations having small amplitudes are thereby suppressed.

On the other hand, the plurality of semiconductor elements EL are connected to each of the inserted circuits 210, so that the number of inserted circuits 210 can be smaller than the number of semiconductor elements EL. The configuration of the semiconductor device 90 can thus be simplified.

As described above, parasitic oscillations occurring among the plurality of semiconductor elements EL connected in parallel with one another can be suppressed by the simple configuration. A case where the plurality of semiconductor elements EL are partitioned into two blocks, the first block BK1 and the second block BK2 (FIG. 3), has been described in the present embodiment, but the number of blocks may be three or more within an acceptable range of complication of the configuration of the device. Parasitic oscillations can more surely be suppressed by increasing the number of blocks.

The semiconductor elements EL (the first semiconductor elements EL1 and the second semiconductor elements EL2) may be silicon carbide semiconductor elements. In this case, the semiconductor device 90 is a semiconductor device using silicon carbide, that is, a silicon carbide semiconductor device. The silicon carbide semiconductor device is often required to perform fast switching operation using properties of a wide-bandgap semiconductor of silicon carbide. Parasitic oscillations are likely to occur in foe fast switching operation. In the present embodiment, however, parasitic oscillations can effectively be suppressed for the above-mentioned reason.

Furthermore, according to the present embodiment, the case 71 and the members housed therein constitute the semiconductor device 90 as a power module, and a configuration to suppress parasitic oscillations can be provided within the power module. In a case where the plurality of inserted circuits 210 (FIG. 2) are mounted on foe printed circuit hoard 60 (FIG. 1) different from the insulating substrate 10 (FIG. 1) on which the plurality of semiconductor elements EL are mounted, the plurality of inserted circuits 210 can easily be mounted. Specifically, there is no need to mount the inserted circuits 210 on the insulating substrate 10 in a case where the inserted circuits 210 are mounted on the printed, circuit board 60, so that the insulating substrate 10 can have a configuration similar to a conventional configuration in which the inserted circuits 210 are not provided. As described above, both suppression of parasitic oscillations and reduction in size of the power module can be provided.

Embodiment 2

Figure 5:
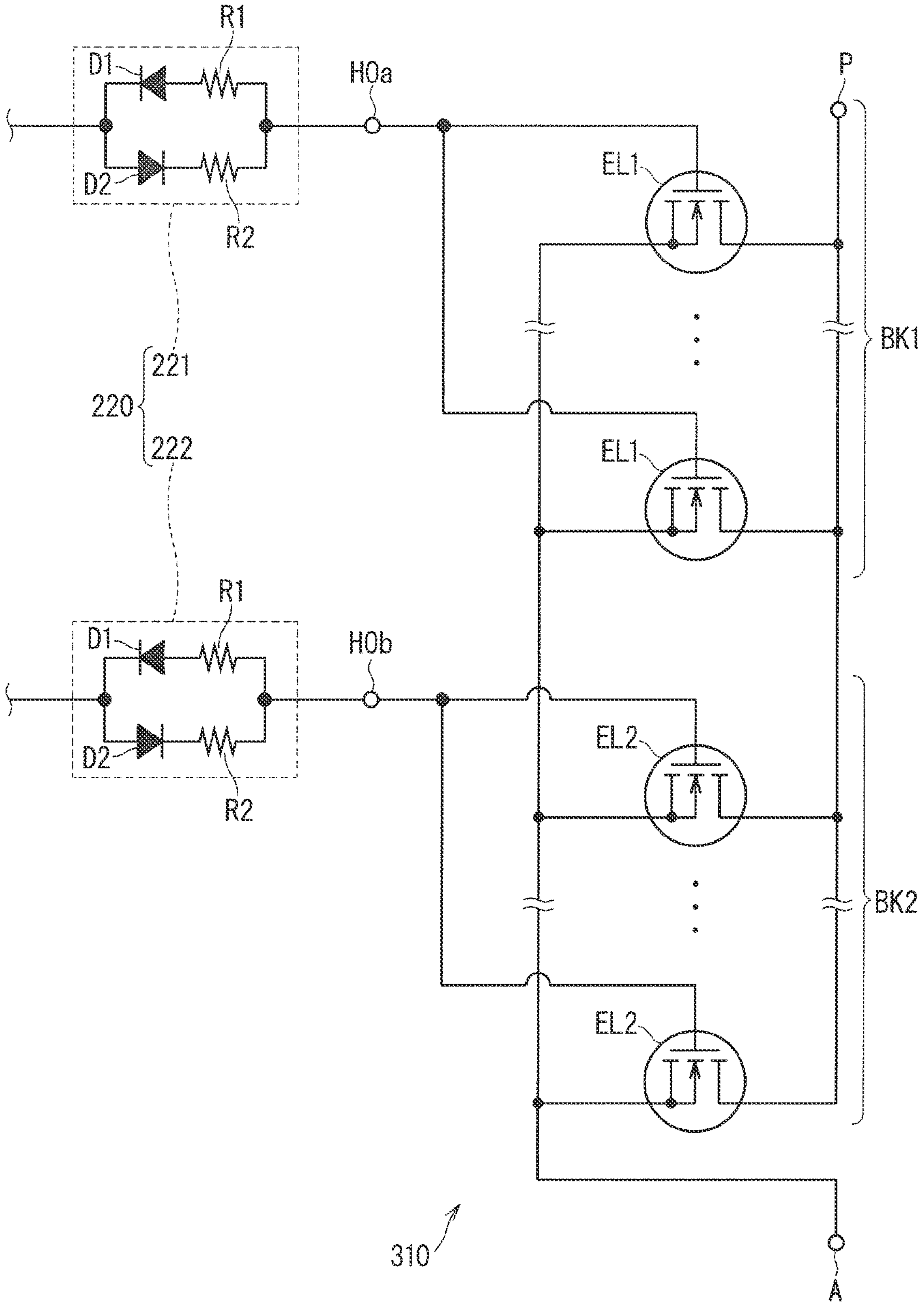
FIG. 5 is a circuit diagram schematically showing an upper arm portion and a plurality of inserted circuits connected to the upper arm portion of a semiconductor device in Embodiment 2.

Referring to FIG. 5, a semiconductor device in Embodiment 2 includes a plurality of inserted circuits 220 in place of the plurality of inserted circuits 210 (FIG. 3: Embodiment 1). Each of the plurality of inserted circuits 220, that is, each of a first inserted circuit 221 and a second inserted circuit 222 includes a first resistive element R1 connected in series with the first diode D1 and connected in parallel with the second diode D2, and includes a second resistive element R2 connected in series with the second diode D2 and connected in parallel with the first diode D1. The other configuration is substantially the same as the above-mentioned configuration in Embodiment 1, so that the same or similar components bear the same reference signs, and description thereof will be not repeated.

According to the present embodiment, when ja current caused due to parasitic oscillations flows because it is not completely interrupted by the first diode D1 and the second diode D2, each of the first resistive element R1 and the second resistive element R2 causes a voltage drop. Parasitic oscillations are thereby damped, so that parasitic oscillations can more surely be suppressed.

The first resistive element R1 and the second resistive element R2 are respectively provided to the first diode D1 and the second diode D2 pointing in opposite directions. Therefore, resistance involved, at turn-on operation of the semiconductor elements and resistance involved at turn-off operation of the semiconductor elements can separately be set for the gate signal.

Embodiment 3

Figure 6:
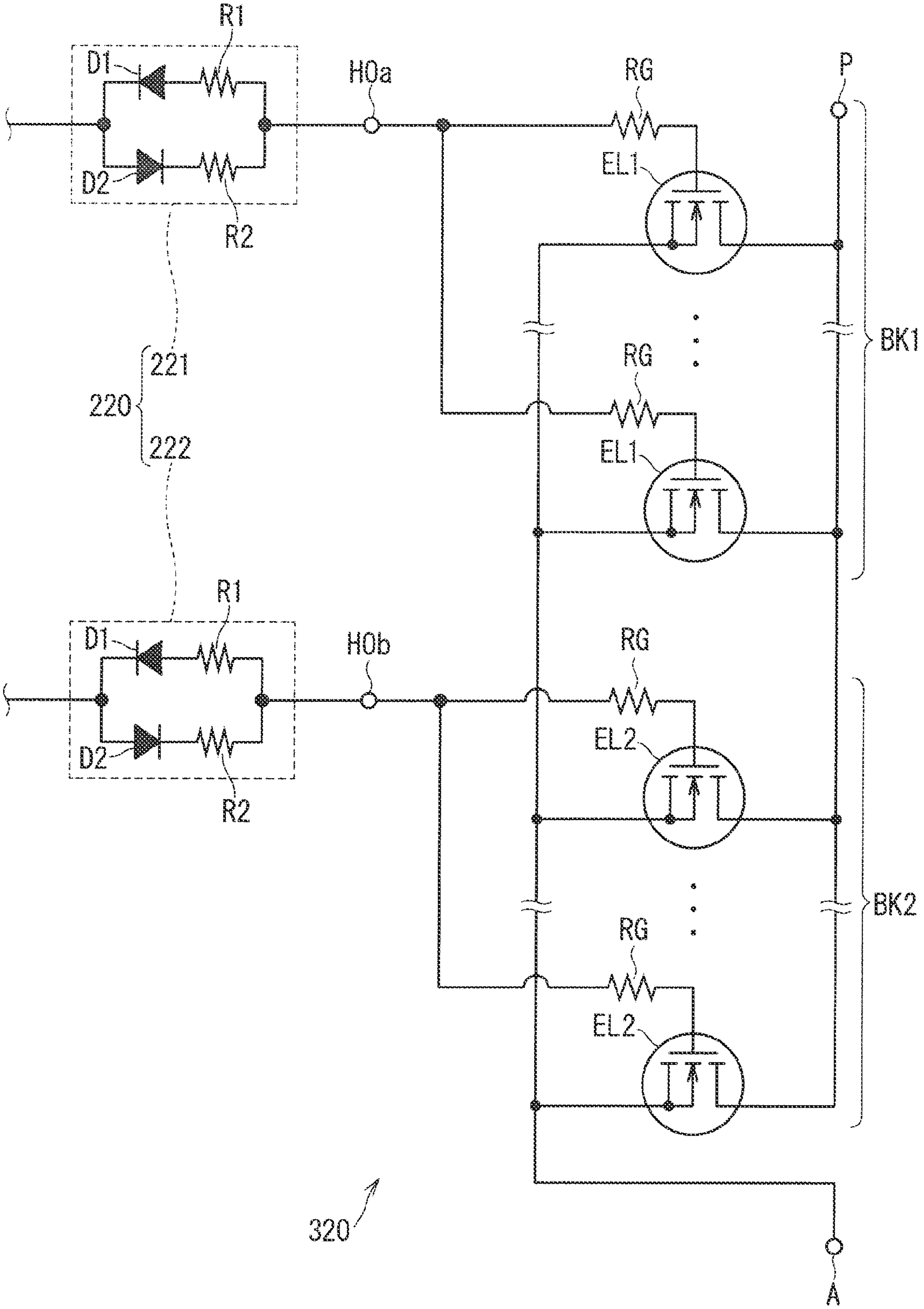
FIG. 6 is a circuit diagram schematically showing an upper arm portion and a plurality of inserted circuits connected to the upper arm portion of a semiconductor device in Embodiment 3.

Referring to FIG. 6, a semiconductor device in Embodiment 3 includes an upper arm portion 320 in place of the upper arm portion 310 (FIG. 5: Embodiment 2). In the upper arm portion 320, a gate resistive element RG is interposed between each of the inserted circuits 220 of the drive circuit and each of the plurality of semiconductor elements EL. Although not shown, the gate resistive element RG is similarly interposed in the lower arm portion. The gate resistive element RG may be a resistive element built in the semiconductor chip 32 in which the semiconductor elements EL are formed, or may be a resistive element added separately from the semiconductor chip.

According to the present embodiment, the plurality of first semiconductor elements EL1 are separated from one another by gate resistive elements RG, and also the plurality of second semiconductor elements EL2 are separated from one another by gate resistive elements RG. Parasitic oscillations are thus less likely to occur among the plurality of first semiconductor elements EL1 and among tire plurality of second semiconductor elements EL2 even if the number of first semiconductor elements EL1 and the number of second semiconductor elements EL2 are relatively large. The number of first semiconductor elements EL1 connected to the first inserted circuit 211 and the number of second semiconductor elements EL2 connected to the second inserted circuit 212 can thus be increased while suppressing parasitic oscillations. In other words, the number of inserted circuits 210 can be even smaller than the number of semiconductor elements EL. On the other hand, the gate resistive element RG required in the present embodiment may be a simple element that can be formed more easily than the diodes. As described above, parasitic oscillations occurring among the plurality of semiconductor elements EL connected in parallel with one another can be suppressed by a simple configuration in which the number of inserted circuits 220 is further reduced.

A case where the gate resistive elements RG are added to the inserted circuits 220 (see FIG. 5) in Embodiment 2 has been described above, but the gate resistive elements RG may be added to the inserted circuits 210 (FIG. 3) in Embodiment 1.

Embodiment 4

Figure 7:
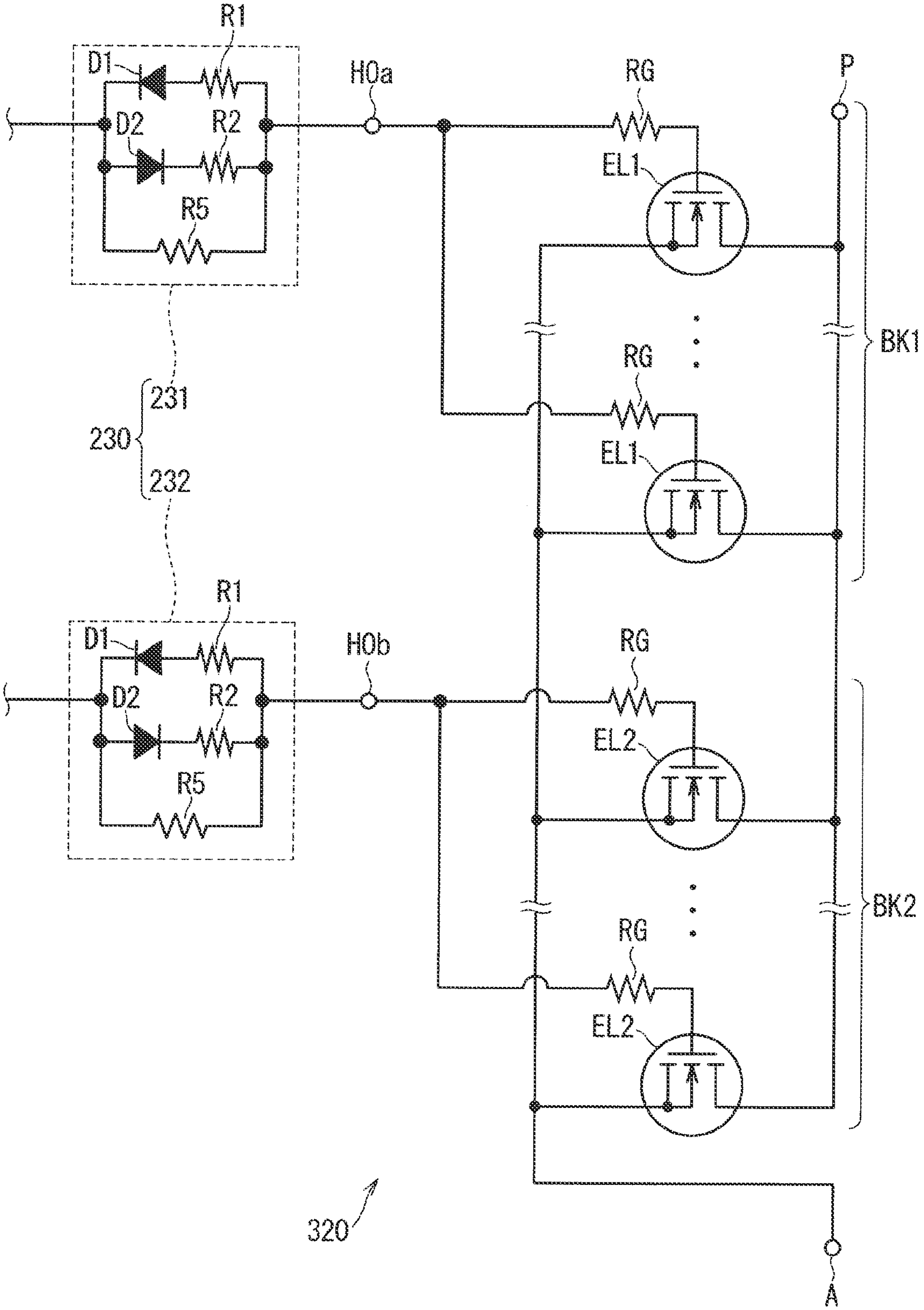
FIG. 7 is a circuit diagram schematically showing an upper arm portion and a plurality of inserted circuits connected to the upper arm portion of a semiconductor device in Embodiment 4.

Referring to FIG. 7, a semiconductor device in Embodiment 4 includes a plurality of inserted circuits 230 in place of the plurality of inserted circuits 220 (FIG. 6: Embodiment 3). Each of the plurality of inserted circuits 230, that is, each of a first inserted circuit 231 and a second inserted circuit 232 includes a resistive element R5 connected in parallel with the first diode D1 and the second diode D2. To sufficiently maintain the effect of suppressing parasitic oscillations of each of the inserted circuits 220, the resistive element R5 preferably has a sufficiently large size relative to the size of each of the first resistive element R1 and the second resistive element R2.

If the resistive element R5 is not provided, a voltage drop corresponding to the forward voltage of the first diode D1 or the second diode D2 is caused in gate voltage applied to each of the semiconductor elements EL as the control signal. In contrast, in the present embodiment the resistive element R5 provides an electrical path to bypass a parallel circuit of the first diode D1 and the second diode D2 to avoid the above-mentioned voltage drop. This enables stable control of the semiconductor elements EL.

A case where the resistive element R5 is added to each of the inserted circuits 220 (see FIG. 6) in Embodiment 3 has been described above, but the resistive elements R5 may be added to each of the inserted circuits 220 (FIG. 5) in Embodiment 2 or each of the inserted circuits 210 (FIG. 3) in Embodiment 1.

Embodiments can freely be combined with each other, and can be modified or omitted as appropriate.

While the invention has been shown and described in detail, the foregoing description is in all aspects illustrative and not restrictive, it is therefore understood that numerous modifications and variations can be devised without departing from tire scope of the invention.

What is claimed is:

1. A semiconductor device comprising:

a plurality of semiconductor elements connected in parallel with one another, and each having a gate electrode, the plurality of semiconductor elements including a plurality of first semiconductor elements each connected in parallel with one another and a plurality of second semiconductor elements each connected in parallel with one another; and a drive circuit to provide a gate signal to the gate electrode of each of the plurality of semiconductor elements, the drive circuit including a main circuit and a plurality of inserted circuits including a first inserted circuit and a second inserted circuit, wherein the first inserted circuit is inserted in series between the main circuit and each of the plurality of first semiconductor elements, the first inserted circuit includes a first diode and a second diode, the first diode having a forward direction toward the main circuit, the second diode being directly connected in anti-parallel with the first diode, the second inserted circuit is inserted between the main circuit and the plurality of second semiconductor elements, and the second inserted circuit includes a first diode and a second diode, the first diode having a forward direction toward the main circuit, the second diode being connected in anti-parallel with the first diode.

2. The semiconductor device according to claim 1, wherein the second inserted circuit includes a first resistive element and a second resistive element, the first resistive element being connected in series with the first diode and connected in parallel with the second diode, the second resistive element being connected in series with the second diode and connected in parallel with the first diode.

3. The semiconductor device according to claim 1, further comprising a gate resistive element interposed between the drive circuit and each of the plurality of semiconductor elements.

4. The semiconductor device according to claim 1, wherein the plurality of first semiconductor elements are a plurality of silicon carbide semiconductor elements, and the plurality of second semiconductor elements are a plurality of silicon carbide semiconductor elements.

5. The semiconductor device according to claim 1, further comprising:

a first substrate on which the plurality of semiconductor elements are mounted;

a second substrate on which the plurality of inserted circuits are mounted; and a case to house the first substrate and the second substrate.

6. The semiconductor device according to claim 1, wherein the second diode is directly connected in anti-parallel with the first diode such that the first diode and the second diode are directly connected to a first node toward the main circuit and a second node away from the main circuit.

7. The semiconductor device according to claim 1, wherein the second inserted circuit is inserted in series between the main circuit and each of the plurality of second semiconductor elements.

8. The semiconductor device according to claim 1, wherein the first inserted circuit is inserted in series between the main circuit and the gate electrodes of each of the plurality of first semiconductor elements, and the second inserted circuit is inserted between the main circuit and the gate electrodes of each of the plurality of second semiconductor elements.

9. The semiconductor device according to claim 1, wherein each of the plurality of first semiconductor elements and the plurality of second semiconductor elements is included in a same arm portion of a same phase of an inverter.

10. The semiconductor device according to claim 1, wherein the first diode and the second diode of the first inserted circuit are directly connected to a same node, and the first diode and the second diode of the second inserted circuit are directly connected to the same node.

11. The semiconductor device according to claim 1, wherein each of the plurality of semiconductor elements is connected in parallel with one another.

12. The semiconductor device according to claim 1, wherein the plurality of first semiconductor elements is connected in parallel with the plurality of second semiconductor elements.

13. A semiconductor device comprising:

a plurality of semiconductor elements connected in parallel with one another, and each having a gate electrode, the plurality of semiconductor elements including a plurality of first semiconductor elements and a plurality of second semiconductor elements; and a drive circuit to provide a gate signal to the gate electrode of each of the plurality of semiconductor elements, the drive circuit including a main circuit and a plurality of inserted circuits including a first inserted circuit and a second inserted circuit, wherein the first inserted circuit is inserted between the main circuit and the plurality of first semiconductor elements, the second inserted circuit is inserted between the main circuit and the plurality of second semiconductor elements, and each of the first inserted circuit and the second inserted circuit includes a first diode, a second diode, and a resistive element, the first diode having a forward direction toward the main circuit, the second diode being connected in anti-parallel with the first diode, and the resistive element being connected in parallel with each of the first diode and the second diode.

14. The semiconductor device according to claim 13, wherein the first inserted circuit is inserted in series between the main circuit and each of the plurality of first semiconductor elements.

15. The semiconductor device according to claim 14, wherein the second inserted circuit is inserted in series between the main circuit and each of the plurality of second semiconductor elements.

16. The semiconductor device according to claim 13, wherein the first inserted circuit is inserted in series between the main circuit and the gate electrodes of each of the plurality of first semiconductor elements, and the second inserted circuit is inserted between the main circuit and the gate electrodes of each of the plurality of second semiconductor elements.

17. The semiconductor device according to claim 13, wherein each of the plurality of first semiconductor elements and the plurality of second semiconductor elements is included in a same arm portion of a same phase of an inverter.

18. The semiconductor device according to claim 13, wherein the first diode and the second diode of the first inserted circuit are directly connected to a same node, and the first diode and the second diode of the second inserted circuit are directly connected to the same node.

19. The semiconductor device according to claim 13, wherein each of the plurality of semiconductor elements is connected in parallel with one another.

20. The semiconductor device according to claim 13, wherein the plurality of first semiconductor elements is connected in parallel with the plurality of second semiconductor elements.

* * * * *